United States Patent [19]
Bruce et al.

[11] Patent Number: 5,140,327
[45] Date of Patent: Aug. 18, 1992

[54] ANALOG TO DIGITAL CONVERTER UTILIZING A SEMICONDUCTOR CAPICITOR ARRAY

[75] Inventors: Richard H. Bruce, Los Altos; Alan G. Lewis, Sunnyvale; Daniel Senderowicz, Berkeley, all of Calif.

[73] Assignee: Xerox Corporation, Rochester, N.Y.

[21] Appl. No.: 678,495

[22] Filed: Apr. 1, 1991

Related U.S. Application Data

[62] Division of Ser. No. 410,566, Sep. 21, 1989, Pat. No. 5,099,239.

[51] Int. Cl.$^5$ .............................................. H03M 1/12
[52] U.S. Cl. ........................................ 341/172; 357/51
[58] Field of Search .................. 341/172; 357/40, 45, 357/51, 54, 59

[56] References Cited

U.S. PATENT DOCUMENTS

| | | | |
|---|---|---|---|
| 3,930,255 | 12/1975 | Means | 340/347 |
| 4,227,185 | 10/1980 | Kronlage | 340/347 |
| 4,333,022 | 6/1982 | Whelan et al. | 307/304 |
| 4,400,690 | 8/1983 | Brokaw et al. | 340/347 |
| 4,849,757 | 7/1989 | Krenik | 341/167 |
| 4,876,544 | 10/1989 | Kuraishi | 341/166 |
| 4,984,197 | 1/1991 | Sakagami | 365/63 |

*Primary Examiner*—A. D. Pellinen
*Assistant Examiner*—B. K. Young
*Attorney, Agent, or Firm*—Townsend and Townsend

[57] ABSTRACT

An improved MOS capacitor array formed on a semiconductor substrate comprises rectangular strips of an active region overlapped by rectangular strips of conductive material. The active region and conductive material are separated by an insulating layer. The strips form an array of capacitors which are more tightly packed than the prior art and which are less sensitive to alignment errors than the prior art.

4 Claims, 9 Drawing Sheets

FIG_8.

ANALOG TO DIGITAL CONVERTER UTILIZING A SEMICONDUCTOR CAPICITOR ARRAY

This is a division of application Ser. No. 07/410,566 filed Sep. 21, 1989 now U.S. Pat. No. 5,099,239.

BACKGROUND OF THE INVENTION

Many measurement or sensing systems require the processing of analogue signals from a large array of detectors. The processing is generally carried out using a digital sub-system, so analogue-to-digital conversion must be performed on the detector outputs.

The analogue-to-digital converter (ADC) must be able to accommodate many simultaneous inputs, and have large throughput. A conventional approach would be to utilize a small number of fast ADCs, each preceded by an analog multiplexer which selects one of the many analog inputs at a time for conversion. However, this technique has limitations; in particular, the analog multiplexing may introduce noise and errors into the analog signals, and the single ADC may be large (an N-bit flash ADC requires $2^N$ comparators and the multiplexing hardware will further increase the chip size) and dissipate significant power in order to meet the speed requirements.

SUMMARY OF THE INVENTION

The present invention is a novel ADC system for achieving a high throughput analog-to-digital converter for interfacing analog sensor arrays to a digital system. The system is based on the use of an array of small, low power ADCs and a shift register to transfer the digital data to the output.

The ADC is implemented on a single chip, and has a throughput similar to the throughput of a fast single ADC. However, the invention eliminates the need for analog multiplexing, and the circuit is sufficiently small that input circuits suitable for connecting directly to the sensor array can be included with the ADCs. Thus, the complete interface between an array of analog sensors and a digital signal processor is realized on a single chip. According to one aspect of the invention, a unique capacitor array is provided that reduces the chip area required to form the array.

Other features and advantages will be apparent in view of the appended drawings and following detailed description.

DETAILED DESCRIPTION OF THE PREFERRED EMBODIMENTS

The features that allow integration of a large number of ADCs on a single chip fall into three main areas. First, the design of the analog input circuit and ADC; second, the generation and distribution of bias and reference voltages, and third, the physical layout of the system as a whole. These three aspects of the design are described in detail below. The techniques described are suitable for implementing a large number of ADCs on a single chip, which in this context could be from a few tens to several hundreds. In preferred embodiment, the techniques are demonstrated with 64 integrated ADCs. To achieve maximum throughput, the design is pipelined. Thus, while an input charge is being integrated (or a voltage sampled), analog-to-digital conversion is being carried out on the previous signal, and at the same time the digital data corresponding to the signal before that is made available at the outputs.

Figure 1:
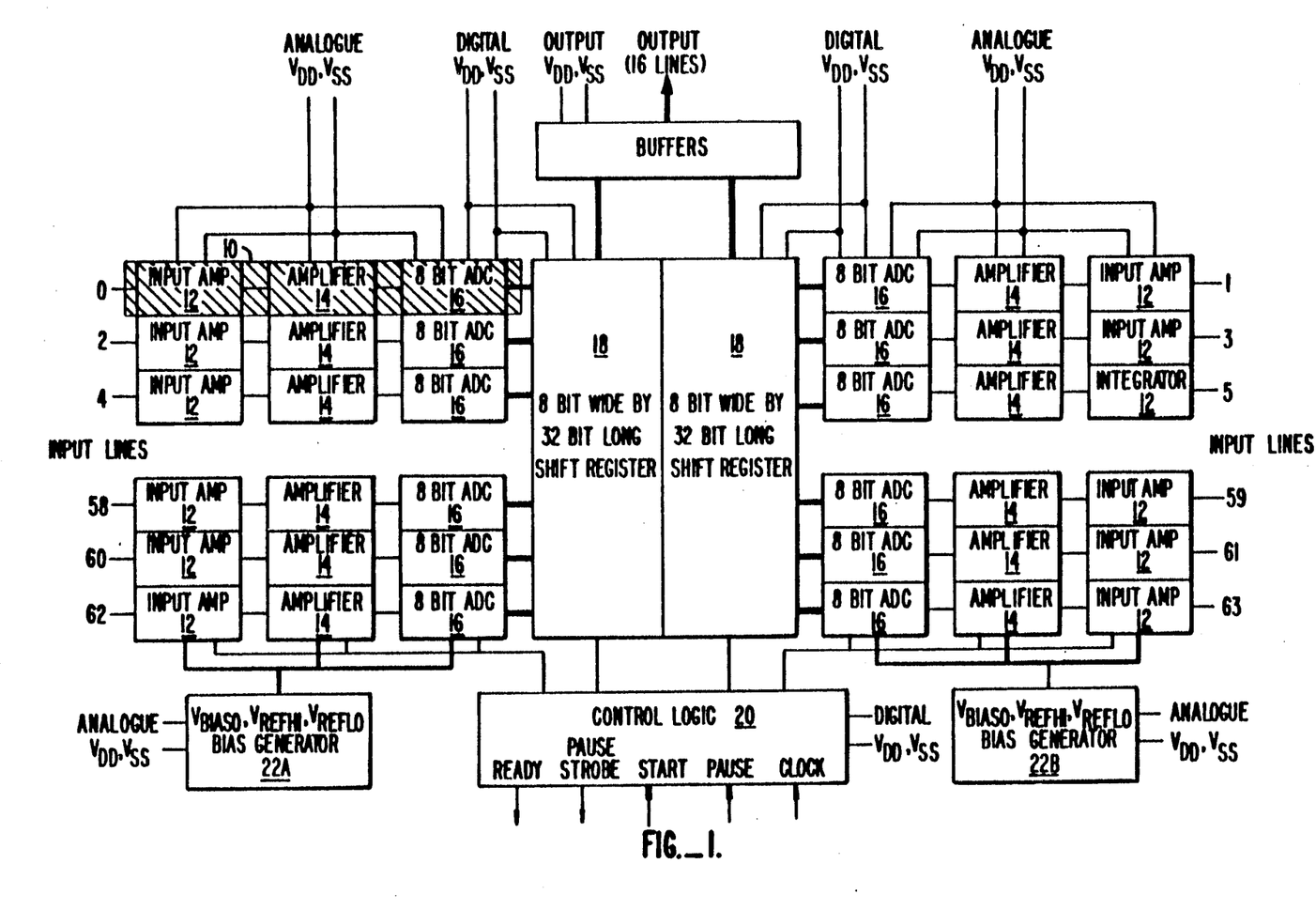
FIG. 1 is a block diagram of the system architecture.

Turning first to the architecture of the system as a whole. FIG. 1 shows the architecture of a Multi-channel Analog-to-Digital Converter (MAD) integrated circuit chip that is a preferred embodiment of the present invention.

In FIG. 1, 64 identical analog channels 10 each consists of an input amplifier 12, which can function either as an integrator with low input impedance for sensing charge from the sensor array or as a switched capacitor buffer with high input impedance for sensing voltage, an intermediate amplifier/reference voltage buffer 14 and an 8-bit successive approximation ADC 16. The digital outputs from the ADC 16 are loaded in parallel into a shift register 18, and subsequently read out serially.

A control logic unit 20 receives externally supplied clock and start and pause synchronization signals, provides control signals to the various analog channels 10 and shift register 18, and an external synchronization signal and pause strobe. The start signal indicates that the system is ready to receive data from an external source and the pause signal allows the system to be temporarily halted without loss of data to facilitate synchronization with slow systems.

The shift register output ports are coupled to an output buffer 22 that drives the signals onto an external bus. On-chip bias generators 23a and b provide bias voltages to the analog channels 10.

The overall architecture illustrated in FIG. 1 has several advantages over the alternative of a multiplexer and single fast ADC. Firstly, the analog signal path is simple and short, minimizing the possibility of signal degradation. The multiplexing is carried out by the shift register 18 on digital data, so there is no loss of information. Second, the system of the invention is more efficient in the sense that the individual sub-circuits are able to operate through most of the chip cycle. In a single ADC system, not only would the ADC have to perform 64 conversions, but there would be significant idle time between each conversion while the analog multiplexer settled and transferred its signal to the ADC.

Figure 2A:
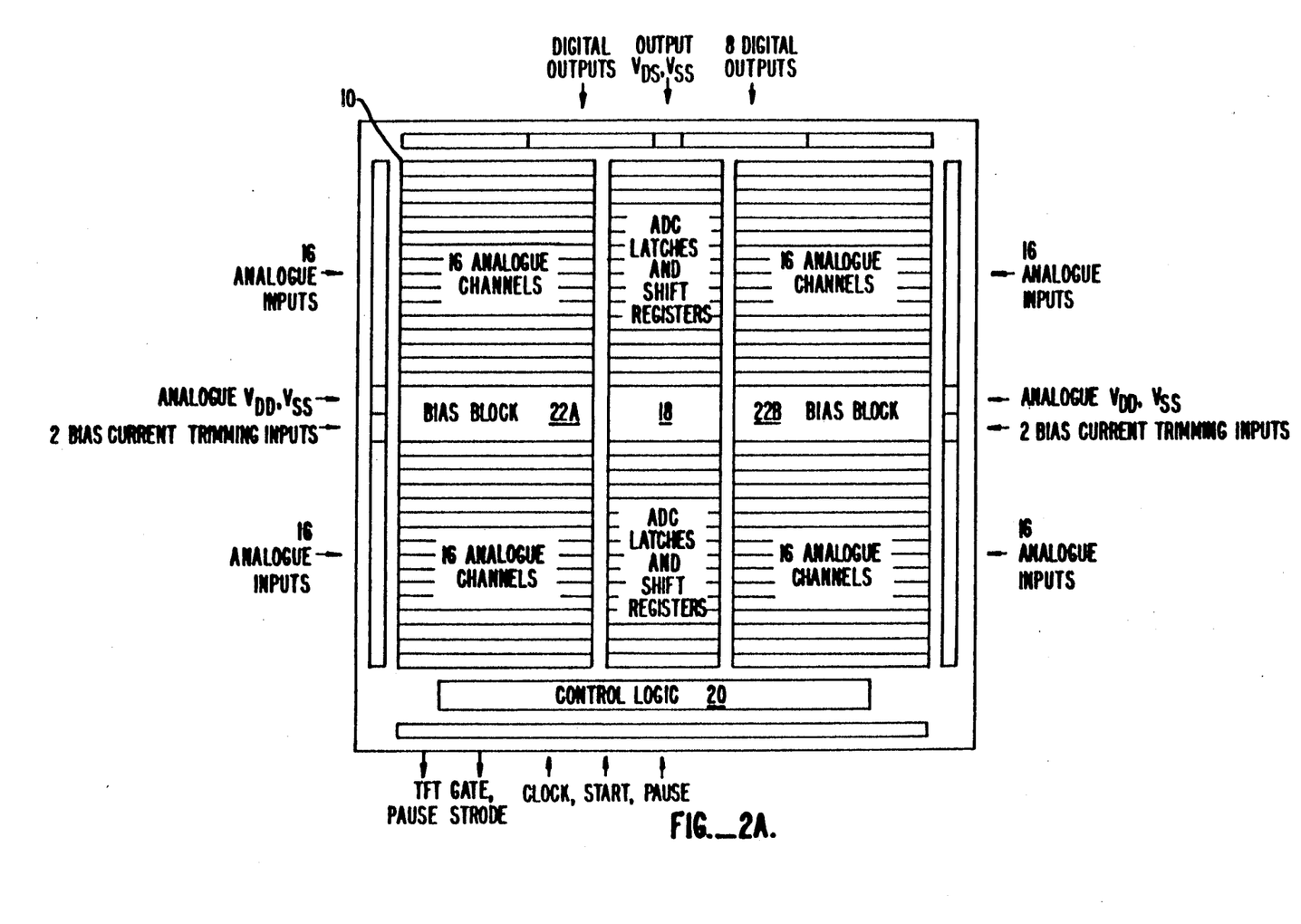
FIG. 2A is a schematic diagram of the chip floorplan.

The physical layout of the preferred embodiment is depicted in FIG. 2A. The physical layout of the system is important from two points of view. First, it determines the packing density of the chip; the most important feature in this respect is the structure of the ADC capacitor array described below. Second, the layout has a strong potential influence on the performance of the system, particularly the analog sections, and it is necessary to adopt an appropriate structure for the high level of integration in the MAD chip.

It can be seen that the system contains significant amounts of digital circuitry as well as analog. A major problem with such mixed systems is the injection of noise into the analog sections from the digital. In the preferred embodiment, several features minimize this noise injection. First, the analog sections are contained in well defined regions of the chip, isolated from the digital circuitry by n- and p-type guard bands this helps minimize the influence of charge injection into the substrate from the digital circuits. Second, separate power supply pads are provided for the analog circuits, digital sections and output buffers, minimizing injection through the supply lines of spurious signals arising from digital switching transients. Third, no digital signals enter the analog sections of the chip except to control the analog switches. Fourth, no analog signal enters the digital sections of the chip.

Each ADC 16 in the analog channel includes an ADC capacitor array is the single largest element in the analog input channel. Thus, minimizing the size of the array is critical to the ability to integrate 64 ADCs on the same chip. The structure of the array utilized in the preferred embodiment is described in detail with reference to FIGS. 2B through 2D.

Figure 2B:
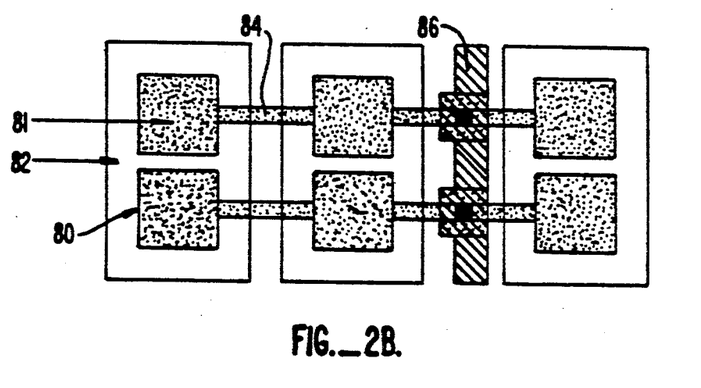
FIG. 2B is a schematic diagram of a typical capacitor array.
Figure 2C:
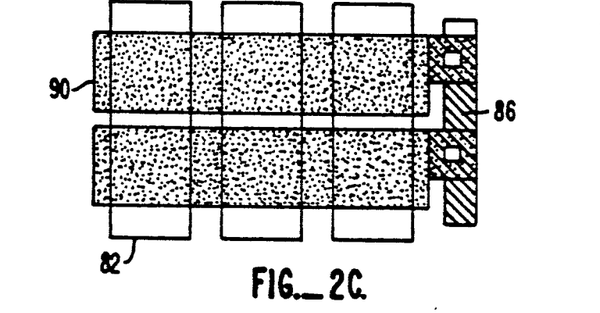
FIG. 2C is a schematic diagram of the capacitor array of the present invention.
Figure 2D:
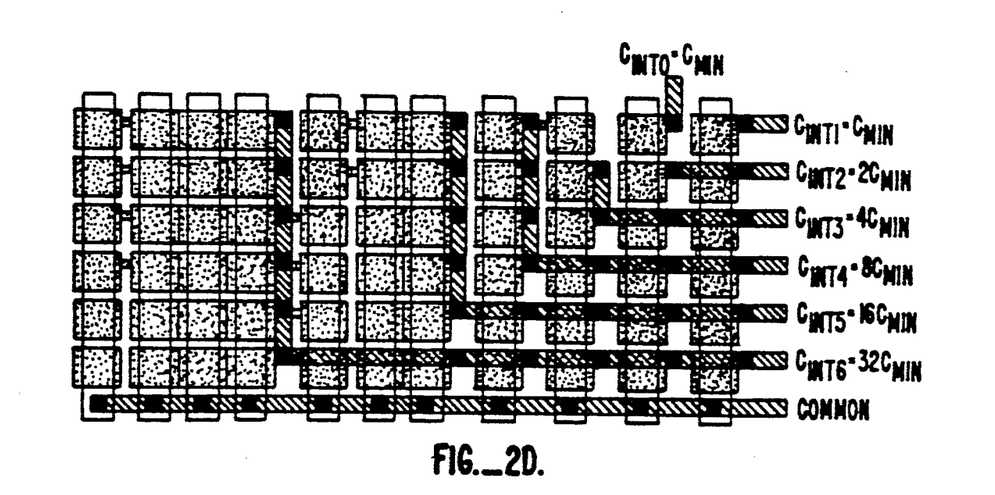
FIG. 2D is a schematic diagram of a complete ADC capacitor array.

The capacitors are binary weighted, such that C(ADC2)=2C(ADC1) and so on; thus C(ADC8)=128(ADC1). In order to ensure close matching, all the capacitors are made up of parallel combinations of a minimum capacitor. Thus, 256 such capacitors are required.

Conventionally, polysilicon to diffusion capacitors 80 are laid out as shown in FIG. 2B. An island of polysilicon 81 is entirely surrounded by active area 82, and a small strip 84 is used to connect a polysilicon island 81 to a metal contact 86 on thick oxide. All the capacitors 80 in an ADC array must be laid out in the same way.

In the present chip, an alternative layout is used to reduce the area as depicted in FIG. 2C. In this layout, the capacitance is set by the area of overlap of a polysilicon strip 90 with an active area diffusion 80. By ensuring that the polysilicon strip 90 crosses the diffusion completely, the capacitance is insensitive to alignment errors between the edges of the poly island 81 and the edge of the active area 82 that occur in the layout depicted in FIG. 2B. This allows tighter packing of the capacitors 80, as illustrated in FIG. 2C.

FIG. 2D shows a complete ADC capacitor array using the layout described with reference to FIG. 2C. For simplicity, a 6-bit array is shown, although the area saving with this technique increases with the number of capacitors. Note that very little area is used for wiring between the capacitors 80 since they can often simply be butted together. The wiring is also almost entirely contained within the array without area penalty, and no metal line passes over a capacitor plate to which it is not connected. This technique thus allows a very compact ADC capacitor array to be realized; a similar array laid out conventionally is approximately 60% larger, corresponding to an increase of about 10% in chip area.

Figure 3:
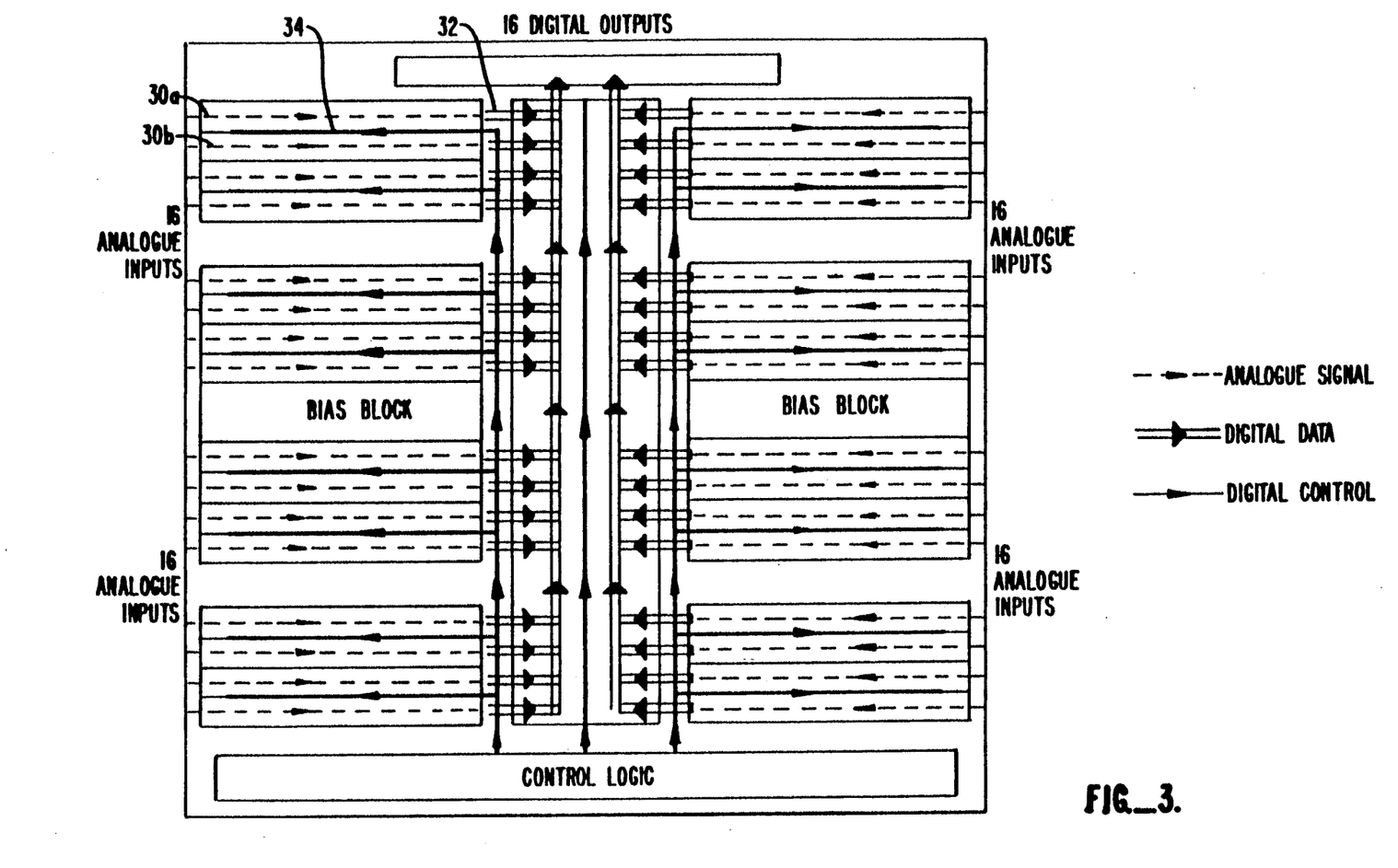
FIG. 3 is a schematic diagram depicting the analog and digital signal paths.

FIG. 3 shows a simplified floor plan of a Multi-Channel Analog to Digital Converter (MADC) chip illustrating this separation of analog signal path 30, digital data signal path 32, and digital control signal paths 34. The digital signal paths 32 include the connection from the ADC 16 to the shift register 20 and the shift register itself. Note that none of these digital signal paths 32 cross the analog signal paths 30. The input circuits and ADCs are laid out in mirrored pairs (so that each channel 10 is the mirror image of the ones above and below it). Thus, a pair of analog signal paths 30a and 30b are controlled by a single digital signal path 30. The digital control lines for controlling the switches in each of the pair 30a and 30b branch from the digital control path 30 thus minimizing the intrusion of digital signals into the analog channel. Further, this feature allows the pair 30a and 30b to share control lines, again saving area.

Turning next to the design of the analog channel 10 and the ADC, each analog channel is pipelined to achieve high throughput.

Figure 4:
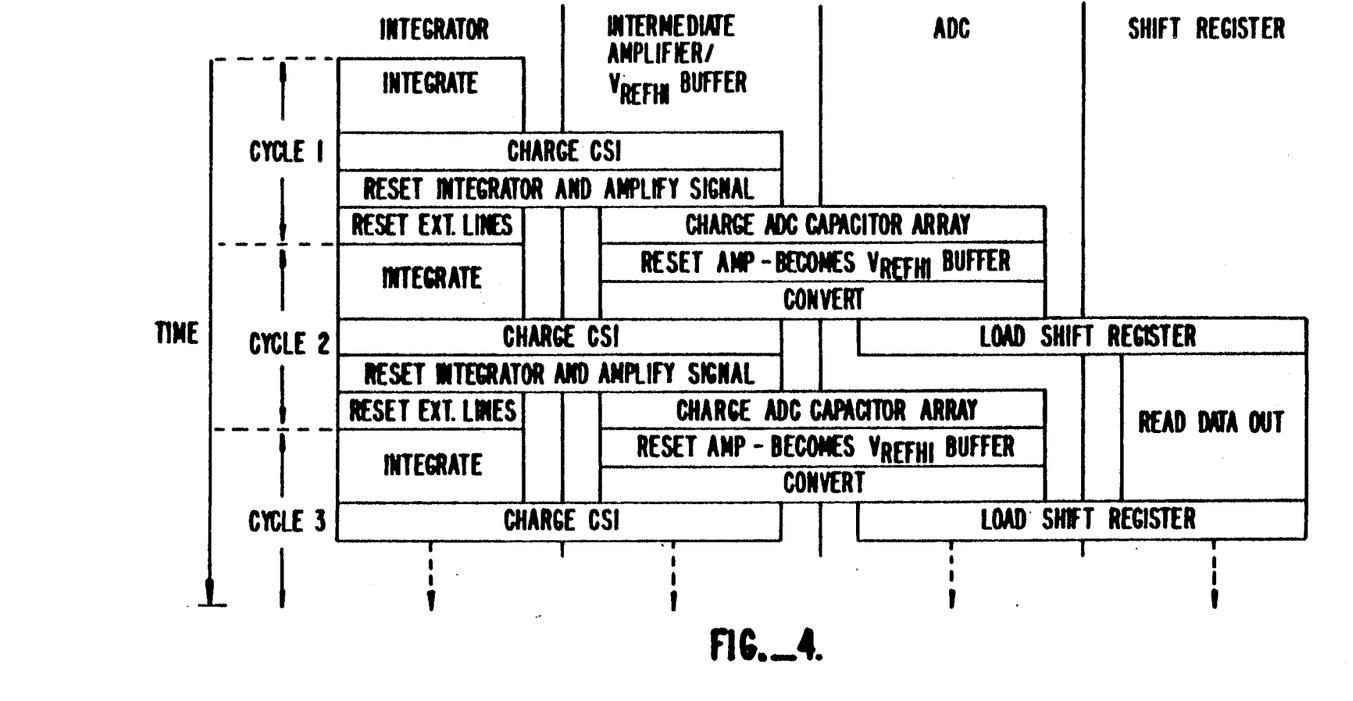
FIG. 4 is a schematic diagram illustrating pipelining.

FIG. 4 is a schematic diagram illustrating the pipeline stages of a single analog channel 10.

An input analog charge signal is received at the beginning of each charge cycle. As is depicted in cycle 1, firstly, a first analog input signal is integrated to form an input voltage signal, secondly, the input capacitor CS1 is charged to the input voltage signal level, thirdly the integrator is reset and the input voltage signal is amplified by the intermediate amplifier to a first amplified voltage level, and finally, the ADC capacitors are charged by the intermediate amplifier to the first amplified voltage level while the external lines are reset. These processing steps are the same for each received analog input signal.

Pipelining is illustrated in cycles 2 and 3. A second analog signal is integrated at the beginning of cycle 2 while the first input voltage signal is converted to a digital representation by the ADC. During this conversion the intermediate amplifier supplies VREFHI to the ADC. The digital representation of the first analog signal is loaded to the digital shift register while CS1 is charged to the second input voltage level. The readout of the digital representation of the first analog input signal via the digital shift register is started at the end of cycle 2 while the second input voltage level is amplified and stored in the ADC.

After two cycles the pipeline is full and three signals are processed each cycle. At the beginning of cycle 3 a third analog charge signal is integrated while the second analog signal is converted and the digital representation of the first analog signal is shifted to the output buffer. A novel feature of this pipeline is the use of the amp 14 both to amplify the input signal to charge the ADC capacitors to the input voltage and as a buffer to provide a reference voltage during the conversion operation.

The input circuit and ADC are replicated 64 times on the system chip. It is thus critical to the ability to achieve this level of integration that each channel be physically small enough, while at the same time maintaining adequate speed for the required throughput and a reasonable power dissipation. The issue of speed is partially dealt with by the pipelined architecture, but a number of other novel features are also necessary as described below.

Figure 5:
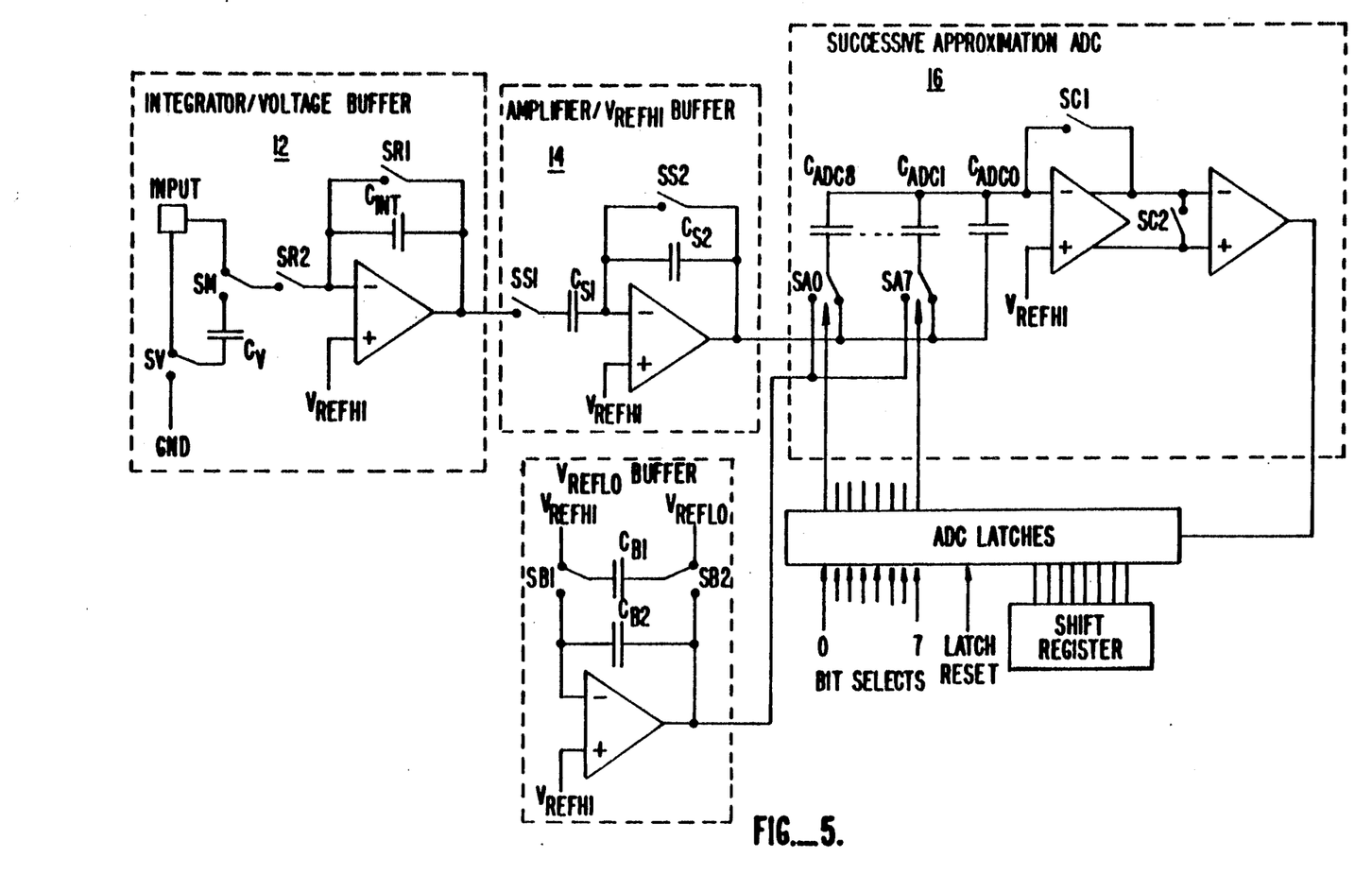
FIG. 5 is a schematic diagram of an analog channel.
Figure 6:
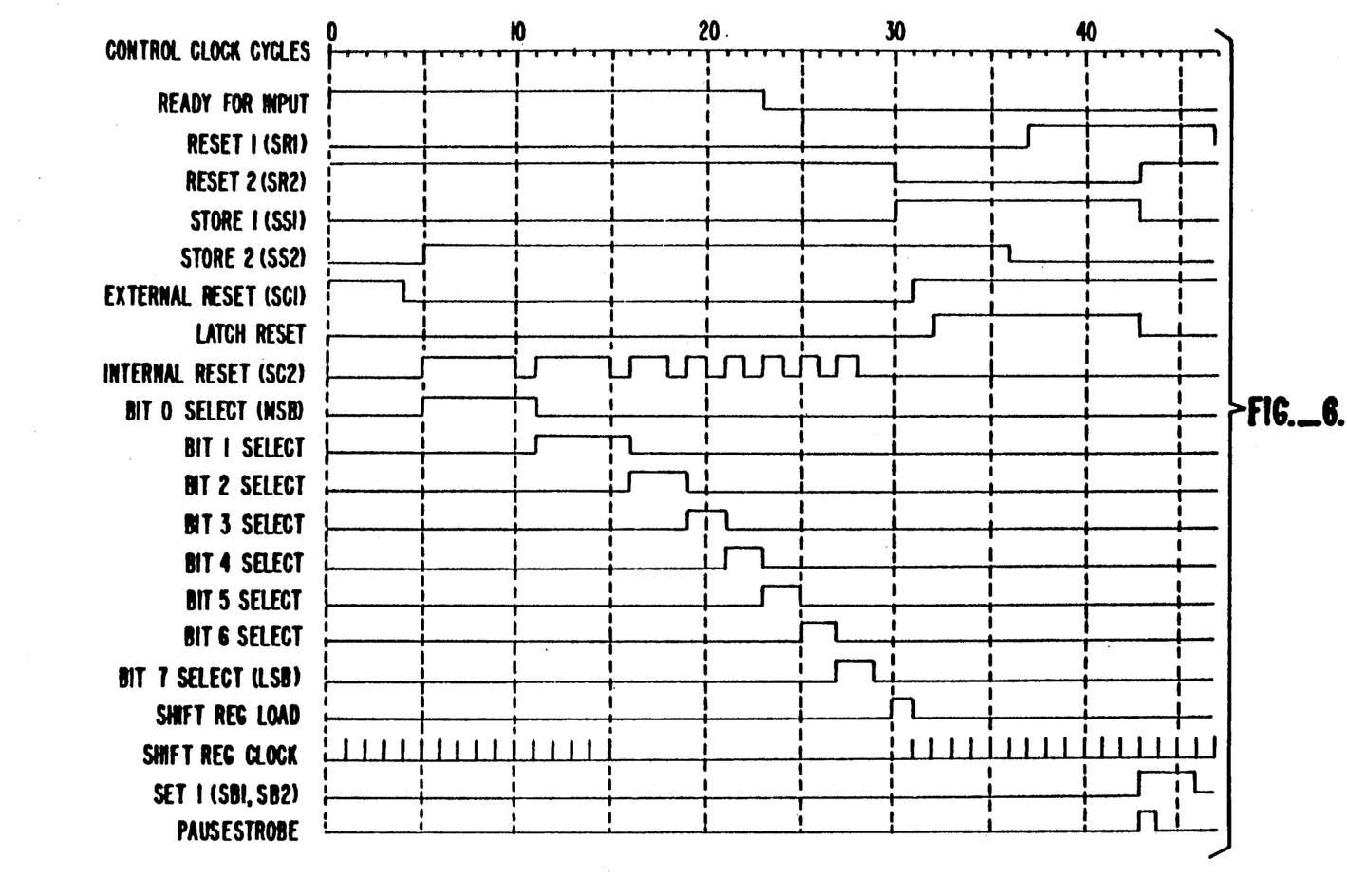
FIG. 6 is a timing diagram depicting the states of the control signals that control the operation of the analog channel.

A simplified schematic of the input circuit and ADC is shown in FIG. 5 and a timing diagram showing the timing of all control signals is depicted in FIG. 6. The switches are in the positions shown in FIG. 5 when the control signals depicted in FIG. 6 are low. All the switches shown are MOS transistors driven by control signals from the Control Logic block 20 shown in FIG. 1.

The first stage of the analog channel 20 is the input integrator 12 which can also be used as a voltage buffer; the mode is simply selected by switch SM. In the voltage sensing mode, switch SV switches one plate of the capacitor Cv between the input and ground the other plate is connected to the integrator 12 so that the complete input circuit operates as a sample-and-hold device. For charge sensing, switch SM connects the integrator 12 directly to the input pad. The timing of the rest of the circuit is the same in both voltage sensing and charge sensing modes. The charge sensing mode is the most critical for the system, and is described in the rest of this section.

Charge integration is performed in the conventional manner, resulting in a signal voltage at the output of the integrator 12. Once integration is complete, the signal must be transferred to the intermediate amplifier 14 and the integrator 12 reset. However, the integrator input is connected directly to the external sensor and in general there will be a large parasitic capacitance associated with this link. This appears in parallel with the input capacitance of the operational amplifier used in the integrator, and severely slows both the signal transfer to the intermediate amplifier 14 and the reset. The solution to this problem has been to isolate the integrator input from the external sensor for these operations.

Once the charge has been integrated during control clock cycles 0–30 Reset 2 goes low at control clock cycle 30 and SR2 is opened, isolating the integrator 12 from the input. At this stage Store 2 is high and switch SS2 is already closed to provide VREFHI to the right-hand plate of capacitor CS1, and at control clock cycle 30 Store 1 goes high so that SS1 is also closed to the input signal voltage level, i.e., the integrator output voltage, to the left-hand plate of capacitor CS1. Only the intrinsic integrator operational amplifier input capacitance is present to slow this signal transfer.

Once CS1 is charged to the integrator output voltage. Store 2 goes low at control clock cycle 36 to open SS2 and Reset 1 goes high at control clock cycle 37 to close SR1, shorting the integration capacitor and resetting the integrator 12 so that the output voltage of the integrator 12 becomes VREFHI. The charge from CS1 is transferred to CS2, and the magnitude of the output signal of amp 14 is the integrator output voltage multiplied by a gain factor equal to the ratio of CS1/CS2.

Thus, in the analog input circuit it is the output voltage change at the output of the integrator 12 during reset which is amplified rather than the voltage change during integration, although these two are equal and opposite. Once the integrator 12 is reset, Store 1 goes low at control clock cycle 43 to open SS1, separating the amplifier from the integrator; both are then free to perform other operations, achieving the first level of pipelining. In the case of the integrator, SR2 is first closed to reset the input line and SR1 is the opened to integrate the next analog input charge signal. The amplifier charges the ADC capacitor array as discussed below.

The sequence described above has three advantages in addition to preventing high input capacitance from slowing down signal transfer and reset. First, the integrator reset and signal amplification operations are merged, improving throughput and facilitating the pipelined operation. Second, the load seen by the integrator during integration is very small. Third, the amplification takes up a small part of the chip cycle, making the amplifier 14 available to act as a reference voltage buffer for the rest of the chip cycle as described below.

An important aspect of the input circuit and ADC design which allows minimization of area and power dissipation, as well as improved accuracy, is the dual function performed by the intermediate amplifier 14. The amplification operation is described above; the manner in which it is implemented makes it fast, and also limits it to a time when the ADC is dormant, that is during the signal transfer between integrator and amplifier required for pipelining. Thus, the amplifier is available to act as a reference voltage buffer for the Adc during the time when the ADC is active.

During amplification of the signal, when Store 2 is low, the ADC capacitor array is held at VREFLO, that is switches SA0–SA7 are in the left position in FIG. 5. External reset is high so that SC1 is also closed at this time to provide VREFHI to the upper plates of the ADC capacitors. Once amplification is complete Store 1 goes low at control clock cycle 43 to open SS1 and at the same time the entire ADC capacitor array is connected to the amplifier output (SA0–SA7 swing to their right positions) to provide the amplified input signal voltage to the lower plates of the ADC. The capacitor array is thus charged to difference between VREFHI and the amplified input voltage level. At control clock cycle 4 External reset goes low to open SC1 so that the charge induced by the input voltage signal is trapped on the upper plates of the capacitors. Additionally, at control clock cycle 5 Store 2 goes high to reset the amplifier 16 and provide VREFHI to the lower plates of the ADC capacitors. Accordingly, the comparator input voltage level is equal to the sum of the amplified input voltage level and VREFHI and the ADC is ready to start a conventional charge-sharing successive approximation cycle.

In conventional systems, an amplifier for amplifying the input voltage and separate buffers for providing two reference voltages are provided. Thus, at this stage, the capacitors would be switched in turn between the two reference voltages (VREFHI and VREFLO in this case). However, as described above, in the present system SS2 is closed before the ADC cycle starts so that the amplifier 14 acts as a voltage follower, buffering VREFHI.

The use of the intermediate amplifier to fulfill these two requirements (signal amplification and VREFHI buffering) is important for two reasons. First, the need for a separate buffer is eliminated, with obvious savings in area and power consumption; it is estimated that the chip area saving is about 10%, while the power saving is nearly 20%. Secondly, since a common line supplies first the amplified input signal and then VREFHI to the ADC 16, the switches SA0–SA7 need only be two-way devices. In conventional ADCs, a capacity for switching between VREFHI, VREFLO, and the input signal voltage must be provided. This reduced switching requirement of the present system results in an area saving greater that of the eliminated reference buffer alone. Third, since the same amplifier is used to supply the input voltage and VREFHI to the ADC, its offset is effectively eliminated.

Figure 7:
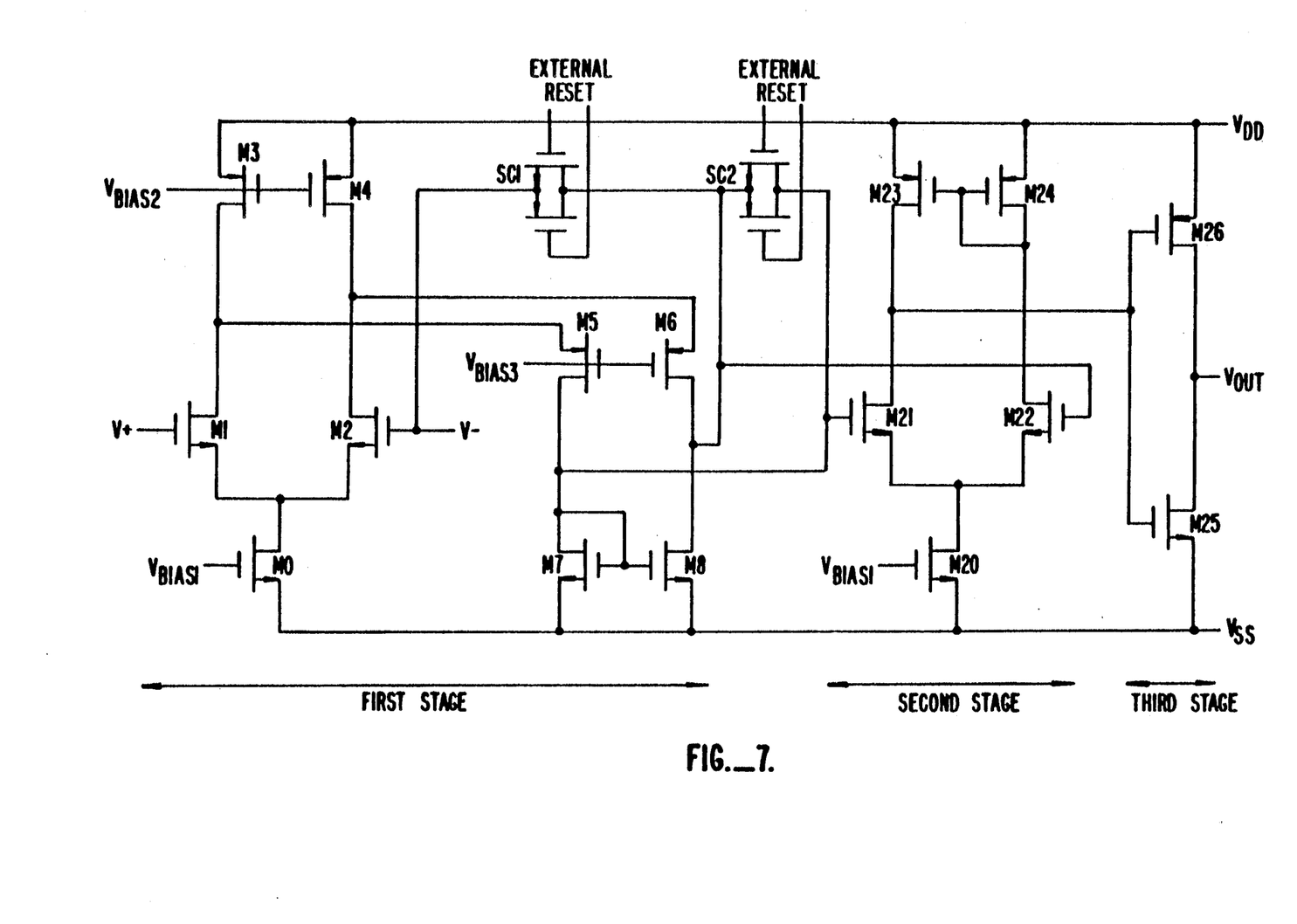
FIG. 7 is a schematic diagram of a comparator.

The comparator used in the ADC is shown schematically in FIG. 7. The switch SC1 applies feedback around the first stage only, so there are no stability problems. Since most of the gain is in this stage, offset and flicker noise suppression is not degraded.

An initialization switch, SC2 controlled by an IntRst signal, is included to force the comparator to a condition close to its toggle point just before each decision in the ADC sequence. This speeds the decision reducing the ADC cycle time and increasing throughput.

Each of the analog input channels 10 described above requires three fixed voltages (in addition to VDD and ground). These are referred to as VBIASO, VREFHI and VREFLO, VBIASO is used by a local bias generator in each channel to set voltages which control the current drawn by each operational amplifier, VREFHI acts as the internal voltage to which all signals are referenced, and VREFLO serves as the voltage defining the gain of the ADC (the gain is actually determined by the difference between VREFHI and VREFLO).

The bias and reference voltages are generated on the chip using band-gap reference circuits. There are major problems associated with generating and distributing the voltages to a large number of channels, each of which presents a significant load. However, on-chip generation does offer a number of advantages, some of which are important in achieving the very high level of analog integration on the system chip.

First, on chip references allow the freedom to choose both the value of the voltages and physical location of the generator. The voltages can thus be chosen for optimum performance of the main analog channels and the distribution lengths can be minimized. It is also possible to choose the number of channels supplied by a single reference generator. The distribution of an external reference voltage would complicate the chip layout, which is critical for such a dense circuit, and compromise the separation of analog and digital sections as described below. The level of performance required of the analog circuitry also imposes constraints on the acceptable noise level and settling times for the reference voltages, and these can be met more readily using on-chip circuitry. Finally, of course, eliminating external references reduces overall system cost.

The analog circuitry on the system chip is divided into two separate halves, which have no direct communication, as described above. Thus, two separate bias and reference generators 22a and b are required, each supplying 32 channels. In practice, the cost of this is not large; much of the area in the reference sections is taken up by buffers needed to drive the loads presented by the large number of channels each supplies. If a single reference section were used, it would need to be almost as large as the two used in the MAD chip combined in order to drive the greater load.

The VBIASO generator is designed with a small positive temperature coefficient in order to increase the current drawn by the analog circuits as the chip temperature rises. This partially compensates the degradation in channel mobility with temperature, allowing lower power dissipation at room temperature while maintaining acceptable performance at elevated temperatures. The load seen by the VBIASO generator is very light, and a simple unbuffered generator circuit is adequate.

Figure 8:
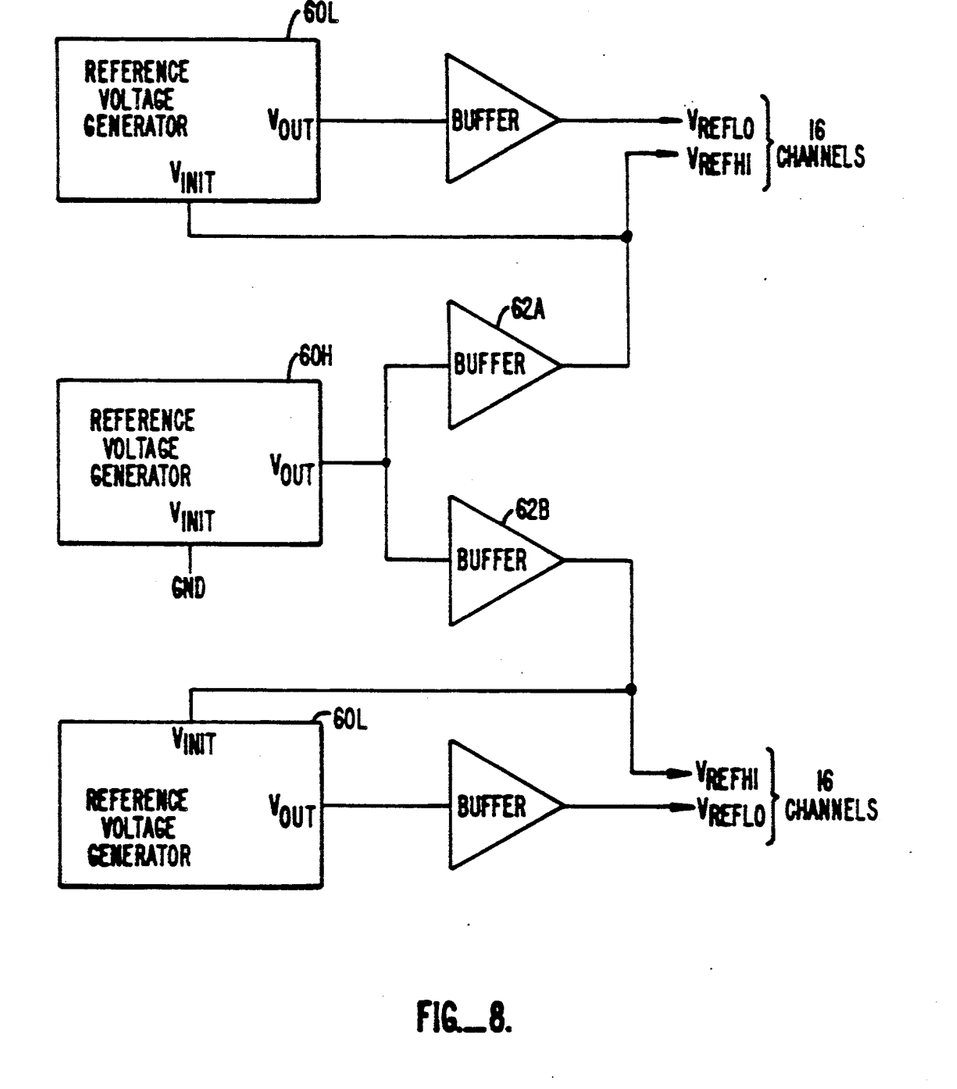
FIG. 8 is a schematic diagram of the reference voltage generation and distribution system.

FIG. 8 is a schematic diagram of the reference voltage generation and distribution circuitry. The two reference voltages VREFHI and VREFLO are generated by conventional temperature compensated band gap reference voltage generators 80H and 80L. The generators 80 produce a voltage offset from a reference value indicated by VINIT. In each reference voltage section, a single VREFHI generator 80H is used, referenced to the external ground produces a voltage level of about 3 volts. The output from this voltage generator is sampled when it is valid by two buffers 82A and B, each supplying 16 channels. This keeps the settling time when all the channels sample or inject charge onto the VREFHI line simultaneously acceptable.

The gain of the ADCs is determined by the difference between VREFHI and VREFLO; to keep this as constant as possible, two VREFLO generators are used in each reference section, each referenced to one of the buffered VREFHI lines, to produce a voltage level of about 1.5 volts below VREFHI. The VREFLO signals are buffered and also delivered to 16 channels as shown.

Note that since the buffered VREFHI voltage is supplied to the VINIT input of the VREFLO voltage generator 80L, the offsets of the VREFHI voltage generator 80H and buffer do not effect the magnitude of the difference between VREFHI and VREFLO.

The 64 analog-to-digital converters used in the system chip are of the conventional charge-sharing, successive approximation type except in two main aspects. First, the switching array is simplified by the dual function amplifier/VREFHI buffer as described above. Secondly, the novel physical capacitor structure is used in the capacitor array in order to minimize its area.

The invention has now been described with reference to a preferred embodiment. Modifications and substitutions will be apparent to a person of skill in the art. Accordingly, the invention is not intended to be limited except as provided by the appended claims.

What is claimed is:

1. An improved MOS capacitor array formed on a major surface of a semiconductor substrate comprising:
    a plurality of substantially rectangular active regions formed along the major surface of said substrate and oriented substantially parallel to a first axis along the surface and
    a plurality of substantially rectangular conductive strips disposed over said active regions, and separated therefrom by an insulating layer, with the rectangular conductive strips oriented substantially perpendicularly to said first axis and with each capacitor in the array formed by the overlap of a conductive strip and an active region, where each rectangular active region is overlapped by 2 or more of said rectangular conductive strips.

2. An improved MOS capacitor array formed on a major surface of a semiconductor substrate comprising:
    a plurality of substantially rectangular active regions formed along the major surface of said substrate and oriented substantially parallel to a first axis along the surface; and
    a plurality of substantially rectangular conductive strips disposed over said active regions, and separated therefrom by an insulating layer, with the rectangular conductive strips oriented substantially perpendicularly to said first axis and with each capacitor in the array formed by the overlap of a conductive strip and an active region, where each rectangular active region is overlapped by 2 or more of said rectangular conductive strips;
    a metallization strip for connecting selected conductive strips in said plurality wherein said metallization strip does not overlap any portion of any of said active regions unless said portion is also overlapped by one of said conductive strips.

3. An improved MOS capacitor array formed on a major surface of a semiconductor substrate comprising:

a plurality of substantially rectangular active regions formed along the major surface of said substrate and oriented substantially parallel to a first axis along the surface; and a plurality of substantially rectangular conductive strips disposed over said active regions, and separated therefrom by an insulating layer, with the rectangular conductive strips oriented substantially perpendicularly to said first axis and with each capacitor in the array formed by the overlap of a conductive strip and an active region, where each rectangular active region is overlapped by 2 or more of said rectangular conductive strips; said capacitors in a rectangular array such that each capacitor in the array is in-line with a number of capacitors equal to the number of conductive strips minus one along a line parallel to said first axis, and where each capacitor in the array is in-line with a number of capacitors equal to the number of active region strips minus one along a line perpendicular to said first axis.

4. The capacitor array of claim 3 further comprising:
a metallization strip for connecting selected conductive strips where said metallization strip does not overlap any portion of any of said active regions unless said portion is also overlapped by one of said conductive strips.

* * * * *